(12) United States Patent
Erickson et al.

(10) Patent No.: US 11,911,825 B2
(45) Date of Patent: Feb. 27, 2024

(54) FUSING ELECTRONIC COMPONENTS INTO THREE-DIMENSIONAL OBJECTS VIA ADDITIVE MANUFACTURING PROCESSES

(71) Applicant: HEWLETT-PACKARD DEVELOPMENT COMPANY, L.P., Spring, TX (US)

(72) Inventors: Kristopher J. Erickson, Palo Alto, CA (US); David George, Palo Alto, CA (US); Sterling Chaffins, Corvallis, OR (US); Lihua Zhao, Palo Alto, CA (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 16/606,310

(22) PCT Filed: Mar. 13, 2018

(86) PCT No.: PCT/US2018/022177
§ 371 (c)(1),
(2) Date: Oct. 18, 2019

(87) PCT Pub. No.: WO2019/177593
PCT Pub. Date: Sep. 19, 2019

(65) Prior Publication Data
US 2021/0362411 A1    Nov. 25, 2021

(51) Int. Cl.
*B29C 64/165* (2017.01)
*B22F 7/08* (2006.01)
(Continued)

(52) U.S. Cl.
CPC ............. *B22F 7/08* (2013.01); *B29C 64/112* (2017.08); *B29C 64/165* (2017.08);
(Continued)

(58) Field of Classification Search
CPC ..... B29C 64/35; B29C 64/112; B29C 64/194; B29C 64/165; B29C 64/209;
(Continued)

(56) References Cited

U.S. PATENT DOCUMENTS 6,864,118 B2 * 3/2005 Stasiak ................ H10K 50/155
257/40
7,265,063 B2 * 9/2007 Mardilovich ......... H01L 21/312
257/E21.414
(Continued)

FOREIGN PATENT DOCUMENTS

CN      105408095 A    3/2016
CN      105409335 A    3/2016
(Continued)

OTHER PUBLICATIONS

Bambach, " DE-102016111047-B3, Process and Plant for Combined Additive and Forming Production", Oct. 26, 2017, Clarivate Analytics, Entire Document (Year: 2017).*
(Continued)

*Primary Examiner* — Joseph S Del Sole
*Assistant Examiner* — Margaret B Hayes
(74) *Attorney, Agent, or Firm* — SHOOK, HARDY & BACON L.L.P.

(57) ABSTRACT

In an example, a method is described that includes building a first layer of a three-dimensional heterogeneous object in a first plurality of passes of an additive manufacturing system. An electronic component is inserted directly into the first layer. The electronic component is then fused to the first layer in a second plurality of passes of the additive manufacturing system.

5 Claims, 4 Drawing Sheets

(51) Int. Cl.
  *B33Y 10/00* (2015.01)
  *B33Y 30/00* (2015.01)
  *B33Y 70/00* (2020.01)
  *B29C 64/194* (2017.01)
  *B29C 64/112* (2017.01)
  *H05K 1/18* (2006.01)
  *H05K 3/28* (2006.01)
  *H05K 3/32* (2006.01)
  *H05K 3/46* (2006.01)
  *B29K 105/16* (2006.01)
  *B29L 31/34* (2006.01)

(52) U.S. Cl.
  CPC ............ *B29C 64/194* (2017.08); *B33Y 10/00* (2014.12); *B33Y 30/00* (2014.12); *B33Y 70/00* (2014.12); *H05K 1/186* (2013.01); *H05K 3/284* (2013.01); *H05K 3/32* (2013.01); *H05K 3/4664* (2013.01); *B29K 2105/162* (2013.01); *B29K 2995/0005* (2013.01); *B29L 2031/3425* (2013.01); *H05K 2201/10022* (2013.01); *H05K 2201/10628* (2013.01); *H05K 2203/1131* (2013.01)

(58) Field of Classification Search
  CPC ... B29C 64/386; B29C 64/393; B29C 64/205; B29C 64/379; H05K 1/186; H05K 1/188
  See application file for complete search history.

(56) References Cited

U.S. PATENT DOCUMENTS

| | | | |
|---|---|---|---|
| 9,156,999 B2 * | 10/2015 | Ng | B33Y 70/00 |
| 9,555,583 B1 | 1/2017 | Dirk et al. | |
| 10,375,765 B2 * | 8/2019 | Chaffins | H05K 1/16 |
| 10,905,017 B2 * | 1/2021 | Shabtai | B33Y 50/02 |
| 2013/0015609 A1 | 1/2013 | Landau | |
| 2013/0170171 A1 * | 7/2013 | Wicker | B33Y 70/00 29/832 |
| 2014/0314964 A1 | 10/2014 | Ackelid | |
| 2015/0135530 A1 | 5/2015 | Belanger | |
| 2015/0197063 A1 | 7/2015 | Shinar et al. | |
| 2016/0197417 A1 | 7/2016 | Busbee | |
| 2016/0198576 A1 * | 7/2016 | Lewis | B29C 64/106 361/761 |
| 2016/0218287 A1 * | 7/2016 | McAlpine | H10K 71/13 |
| 2017/0015065 A1 * | 1/2017 | Potter | B29C 64/393 |
| 2017/0079139 A1 | 3/2017 | Wu | |
| 2017/0087639 A1 | 3/2017 | Folgar et al. | |

FOREIGN PATENT DOCUMENTS

| | | | |
|---|---|---|---|
| CN | 106313573 A | 1/2017 | |
| CN | 106715085 A | 5/2017 | |
| DE | 102016208196 A1 | 11/2017 | |
| EP | 3233425 | 10/2017 | |
| WO | WO-2014209994 A2 * | 12/2014 | ............ B29C 64/00 |
| WO | 2015/065510 A1 | 5/2015 | |
| WO | WO2016146374 A1 | 9/2016 | |
| WO | WO2017074397 A1 | 5/2017 | |
| WO | WO-2017180169 A1 * | 10/2017 | .......... B29C 64/165 |
| WO | 2018/022034 A1 | 2/2018 | |
| WO | WO-2018022034 A1 * | 2/2018 | .......... B29C 64/112 |

OTHER PUBLICATIONS

Li, J. et al., "Hybrid additive manufacturing of 3D electronic systems", Journal of Micromechanics and Microengineering, Aug. 23, 2016, vol. 26, No. 10, 15 pages.

* cited by examiner

FUSING ELECTRONIC COMPONENTS INTO THREE-DIMENSIONAL OBJECTS VIA ADDITIVE MANUFACTURING PROCESSES

BACKGROUND

Additive manufacturing processes (also referred to as "three-dimensional printing" processes) are often used to fabricate three-dimensional objects. These three-dimensional objects may include electronic circuits and devices which include both conductive and non-conductive regions as well as passive and/or active electronic components (e.g., resistors, transistors, capacitors, diodes, inductors, electrical and/or mechanical switches, battery encasements and/or batteries, wires or conductive pins, universal serial bus connectors or other electronic cable connector types, sensors, integrated circuits, and the like).

DETAILED DESCRIPTION

The present disclosure broadly describes an apparatus, method, and non-transitory computer-readable medium for fusing electronic components into three-dimensional objects via additive manufacturing processes. As discussed above, additive manufacturing processes may be used to fabricate electronic circuits and devices which include both conductive and non-conductive regions as well as passive and/or active electronic components (e.g., resistors, transistors, capacitors, diodes, inductors, electrical and/or mechanical switches, battery encasements and/or batteries, wires or conductive pins, universal serial bus connectors or other electronic cable connector types, sensors, integrated circuits, and the like). Conventionally, this has been accomplished by using an additive manufacturing process in combination with other fabrication processes (which may include other additive manufacturing process). For instance, one or more additive manufacturing processes may be used to fabricate the conductive and/or non-conductive regions. Once the conductive and/or non-conductive regions are removed from the additive manufacturing system(s), the electronic components may then be physically and electrically connected to the conductive and/or non-conductive regions. Optionally, additional additive manufacturing processes may be performed after connection of the electronic components, e.g., to enclose the electronic components.

This approach may slow the overall fabrication process, as additive manufacturing processes may be paused in order to connect the electronic components. Moreover, the quality of the physical and electrical connections of the electronic components may be less than optimal depending on the pliability of the conductive and/or non-conductive regions, which begin to cool and harden once removed from the additive manufacturing system.

Examples of the present disclosure fabricate three-dimensional objects including electronic components using a single additive manufacturing process by leveraging conditions of the single additive manufacturing process to facilitate physical and electrical connection of the electronic components. For instance, during some types of additive manufacturing processes, such as multi jet fusion processes, heat is used to fuse the materials that form the layers of the three-dimensional object. Examples of the present disclosure insert an electronic component into a three-dimensional object being fabricated simultaneously with fabrication of the three-dimensional object's conductive regions. Thus, the heat used to fuse the layers of the conductive regions can also be used to effectively fuse the electronic component to the conductive regions, without requiring an extra process outside of the additive manufacturing process. Additional layers of the three-dimensional object may subsequently be fabricated over the electronic component using the same additive manufacturing process. This results in a robust physical and electrical connection between the conductive regions and the electronic component, with minimal delay or disruption of the additive manufacturing process.

Examples of the present disclosure are discussed within the context of a multi jet fusion process. In a multi jet fusion process, a computer controls the spreading of powder and jetting of fluid agents to form successive layers of material according to a digital model of an object. The fluid agents may contain fusing agents that cause the powder to fuse into the object, detailing agents that sharpen the resolution of the object, functional agents that provide functionality to the object (e.g., electrical conductivity), or other agents. Some agents may serve more than one purpose (e.g., acting as both a fusing agent and a functional agent, for example). Each of these agents may be activated under certain conditions such as exposure to heat or energy. Thus, as the successive layers fuse to each other, a three-dimensional object is formed. It should be noted, however, that the described examples may be equally applicable to other types of additive manufacturing systems, including systems based on three-dimensional binder jetting. Thus, any references to "fusing" printing fluids could be applicable to "binding" printing fluids as well.

Figure 1:
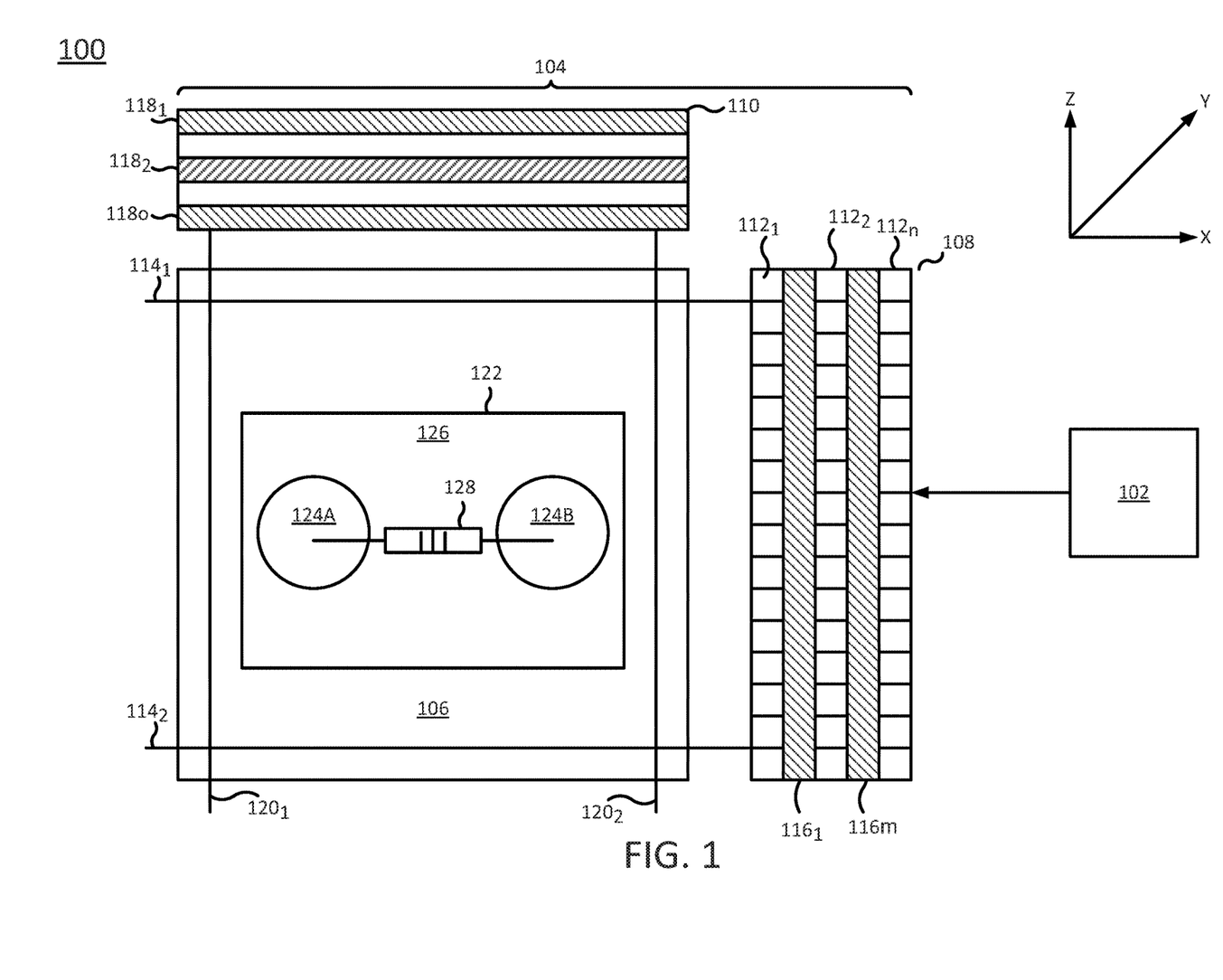
FIG. 1 illustrates a block diagram of a top view of an example system of the present disclosure.

FIG. 1 illustrates a block diagram of a top view of an example system 100 of the present disclosure. In one example, the system 100 is a fluid ejection system, such as an additive manufacturing system using inkjet technology. The system 100 generally includes an image processing system 102 and a print engine 104. The image processing system 102 and print engine 104 work together to fabricate a three-dimensional object 122 via selective addition of a material, such as various fluid agents. In one example, the three-dimensional object 122 is a heterogeneous object comprising at least one conductive region 124A-124B, at least one non-conductive region 126, and at least one electronic component 128.

In one example, the image processing system 102 comprises a computing device (e.g., a general purpose computing device or a special purpose computing device) that stores a model of the object 122. In one example, the object 122 is fabricated by the print engine 104 in a series of layers that are fused together. Each of these layers may include conductive and/or non-conductive regions. Thus, the model of the object 122 may comprise a plurality of cross sections or slice images that are reproduced by the print engine 104 in powder and fluid agents, where each slice image corresponds to one or more of the layers of the object 122.

The image processing system 102 sends electronic signals to the print engine 104. These electronic signals, in turn, drive the components of the print engine 104 (discussed in further detail below) to cooperate to fabricate the object 122. Although the image processing system 102 is illustrated as being external or separate from the print engine 104, some image processing system functions may be performed by the image processing system 102. Thus, the system illustrated in FIG. 1 shows one example configuration that may be used to implement the functionality of the image processing system 102 and the print engine 104.

In one example, the print engine 104 comprises a build bed 106, a movable fluid ejection array 108, and a moveable curing array 110. The build bed 106 comprises a working area upon which the object 122 is fabricated, and may comprise a substantially flat, planar space.

The moveable fluid ejection array 108 includes a plurality of fluid ejection modules $112_1$-$112_n$ (hereinafter collectively referred to as "fluid ejection modules 112"), each of which may be controlled by a respective fluid ejection module controller (not shown) that receives electronic signals from the image processing system 102. Each fluid ejection module 112 may include a plurality of fluid ejection devices (e.g., dies, pens, nozzles, or the like) for ejecting fluid agents (e.g., fusing agents, detailing agents, functional agents, or the like). The fluid ejection devices may be of the type used in high-speed commercial inkjet printing presses. The moveable fluid ejection array 108 also includes at least one emitter $116_1$-$116_m$ (hereinafter collectively referred to as "emitters 116") for emitting energy (e.g., heat, light, acoustic energy, etc.). The fluid ejection modules 112 and emitter(s) 116 may be arranged as alternating modules on the surface of the moveable fluid ejection array 108.

In one example, the moveable fluid ejection array 108 is moveable in at least two dimensions (or, along two axes of a three-dimensional coordinate plane). In the example illustrated in FIG. 1, the moveable fluid ejection array 108 is moveable along the x dimension (e.g., from left to right across the page of FIG. 1, or along the dimension parallel to the plane of the build bed 106) and along the y dimension (e.g., into the page of FIG. 1, or along the dimension perpendicular to the plane of the build bed 106). In this case, a first set of tracks $114_1$ and $114_2$ supports the moveable fluid ejection array 108 for movement along the x dimension, while a second set of tracks (not shown) supports the moveable fluid ejection array 108 for movement along the y dimension.

The moveable curing array 110 includes at least one material coater $118_1$-$118_o$ (hereinafter collectively referred to as "material coaters 118") for dispensing and spreading a coating material. The material coaters 118 may include blades, rollers, or the like for dispensing and spreading a coating material. The coating material may be dispensed in powder form (e.g., polymer powder).

The moveable curing array 110 is moveable in at least two dimensions (or, along two axes of a three-dimensional coordinate plane). In the example illustrated in FIG. 1, the moveable curing array 110 is moveable along the z dimension (e.g., from top to bottom across the page of FIG. 1, or along the dimension parallel to the plane of the build bed 106 and perpendicular to the dimension along which the moveable fluid ejection array 108 moves) and along the y dimension (e.g., into the page of FIG. 1, or along the dimension perpendicular to the plane of the build bed 106). In this case, a first set of tracks $120_1$ and $120_2$ supports the moveable curing array 110 for movement along the z dimension, while a second set of tracks (not shown) supports the moveable curing array 110 for movement along the y dimension.

As discussed above, the system 100 illustrates one example of an additive manufacturing system that uses inkjet technology (e.g., multi jet fusion). Other additive manufacturing systems may use different types of technology that include additional components, or omit some of the components illustrated in FIG. 1. For instance, an additive manufacturing system that uses three-dimensional binder jetting technology may not include any emitters for emitting energy.

Figure 2:
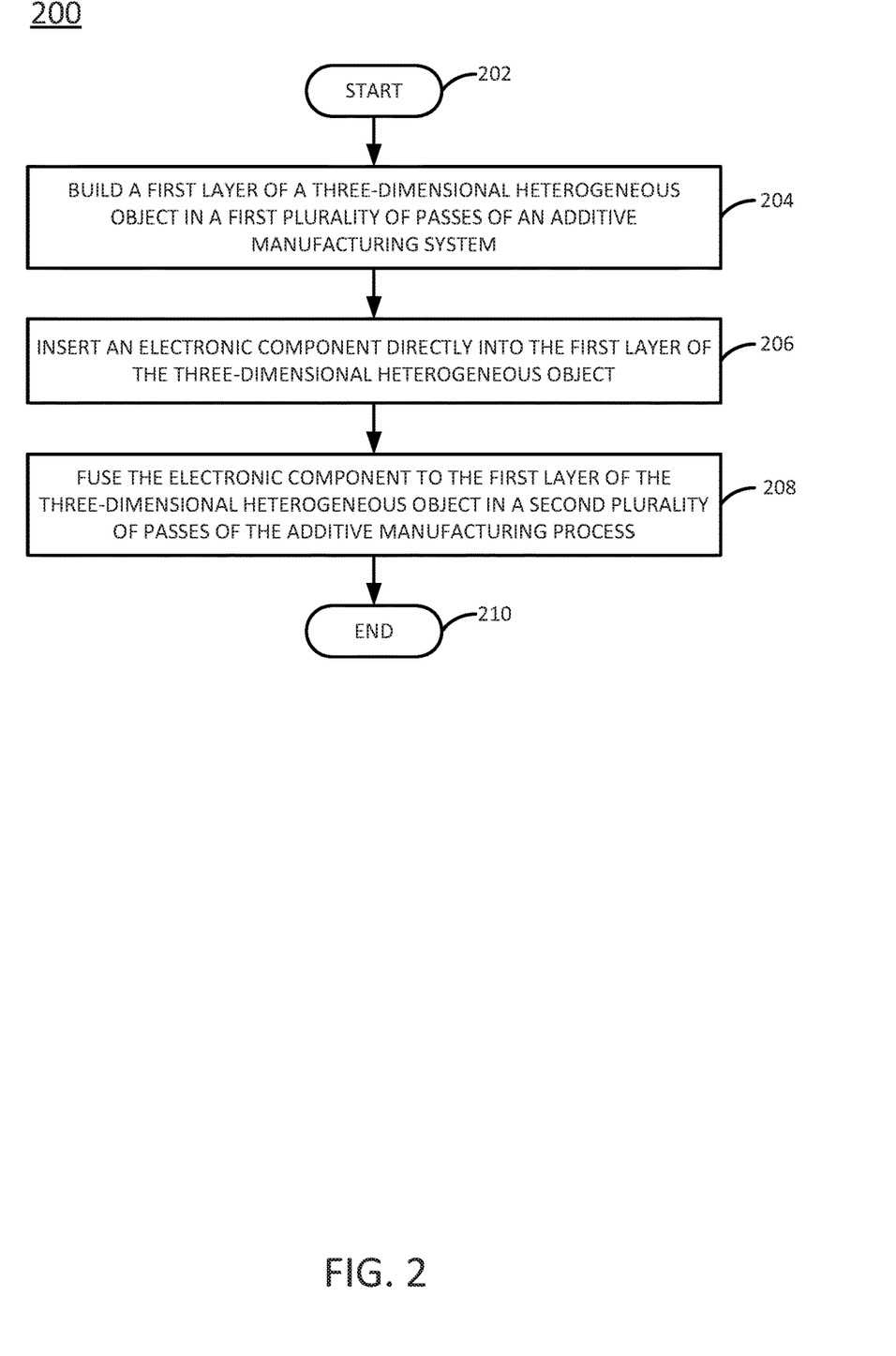
FIG. 2 illustrates a flowchart of an example method for fabricating an object via an additive manufacturing process.

FIG. 2 illustrates a flowchart of an example method 200 for fabricating an object via an additive manufacturing process. The method 200 may be performed, for example, by the system 100 illustrated in FIG. 1. As such, reference is made in the discussion of FIG. 2 to various components of the system 100 to facilitate understanding. However, the method 200 is not limited to implementation with the system illustrated in FIG. 1.

Figure 3A:
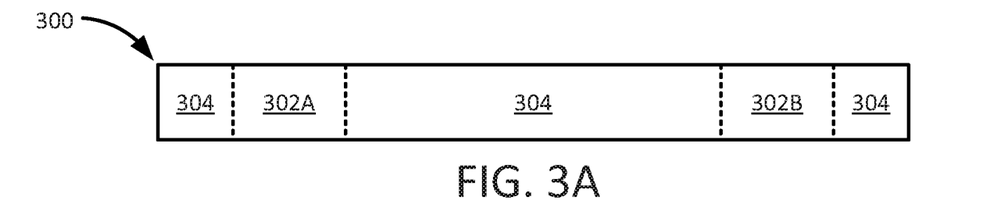
FIG. 3A illustrates one example of a layer of a heterogeneous three-dimensional object that may be fabricated according to the method illustrated in FIG. 2.

The method 200 begins in block 202. In block 204, a first layer of a three-dimensional heterogeneous object is built in a first plurality of passes of an additive manufacturing system. The first layer may be one of a plurality of layers of the three-dimensional heterogeneous object. In one example, the three-dimensional heterogeneous object comprises one or more regions that are electrically conductive as well as one or more regions that are electrically non-conductive. For instance, FIG. 3A illustrates one example of a layer 300 of a heterogeneous three-dimensional object that may be fabricated according to the method illustrated in FIG. 2. Similar to the object 122 illustrated in FIG. 1, the layer 300 includes two conductive regions 302A and 302B (e.g., pads or contacts) that are surrounded by a non-conductive region 304. Although one non-conductive region 304 and two conductive regions 302A-302B are illustrated, the heterogeneous three-dimensional object may include any number of conductive and non-conductive regions. The conductive regions 302A-302B may comprise portions of traces or wires in the final three-dimensional heterogeneous object.

In one example, the additive manufacturing system used to build the first layer in block 204 is a multi jet fusion (MJF) system such as that illustrated in FIG. 1. An MJF system may build the first layer by first coating a thin base layer of material (e.g., powder) on the build bed 106 by the moveable curing array 110 (e.g., by the material coater 118) moving in a first direction along the z dimension. For instance, the coating material may comprise a polymer powder, such as a nylon powder having a particle diameter of approximately twenty to forty micron.

Next, the moveable fluid ejection array 108 may be moved to the appropriate height (e.g., according to the object model) along the y dimension, and then pass across the build bed 106 in a first direction along the x dimension. As the moveable fluid ejection array 108 passes across the build bed, it lays down a layer of fluid agent(s) over at least a portion of the powder. The fluid agents may comprise agents of at least two different types or compositions. For instance, a first fusing agent comprising a silver nanoparticle ink may be used in the conductive regions, while a second fusing agent comprising a metal (e.g., nickel) dithiolene complex may be used in non-conductive regions of the object. In this case, the first fusing agent may also serve as a functional agent that imparts electrical conductivity to the conductive regions.

The moveable curing array 110 may then be moved to the appropriate height (e.g., according to the object model) along the y dimension, and then pass across the build bed 106 in a second direction (e.g., opposite the first direction) along the z dimension. As the moveable curing array 110 passes across the build bed, it emits energy (e.g., heat). Application of the energy to the layer of fluid agent(s) causes the fluid agent(s) to absorb the energy, which in turn causes at least some of the powder to fuse or solidify into the first layer of the object (e.g., layer 300 illustrated in FIG. 3A). Where the fluid agents include agents of two or more different types or compositions, different regions of the first layer may have different properties (e.g., conductive versus non-conductive).

Referring back to FIG. 2, in block 206, an electronic component is inserted directly into the first layer that was built in block 204. The electronic component may comprise any passive and/or active electronic component (e.g., a resistor, a transistor, a capacitor, a diode, an inductor, an electrical and/or mechanical switch, a battery encasement and/or battery, a wire or conductive pin, a universal serial bus connector or other electronic cable connector type, a sensor, an integrated circuit, or the like). The electronic component may be pre-cut and/or bent for insertion into the first layer. In one example, the electronic component is inserted so that it physically contacts at least one conductive region of the first layer. For instance, the electronic component may be inserted with enough pressure to partially embed the electronic component in the conductive region(s), but not so much pressure so that the electronic component contacts any underlying powder. In one example, the conductive region(s) have not yet cooled, and are therefore still pliable, when the electronic device is inserted. Thus, there may not be any pre-made holes in the conductive regions to guide insertion of the electronic component; a moderate amount of pressure will be enough to secure the electronic component in place. In another example, the electronic component may be surface mounted, so that its leads contact the surface of the first layer but are not embedded in it.

Figure 3B:
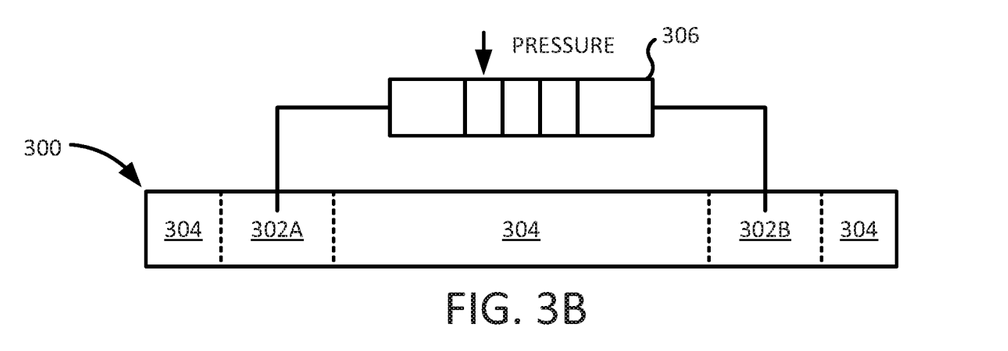
FIG. 3B illustrates an example electronic component inserted into the layer of FIG. 3A.

For instance, FIG. 3B illustrates an example electronic component 306 inserted into the layer 300 of FIG. 3A. In this example, the electronic component 306 is a resistor. As illustrated, the electronic component 306 is inserted so that it makes physical contact with, and actually penetrates the surfaces of, the conductive regions 302A and 302B. However, in other examples, the electronic component 306 may be surface mounted, i.e., so that its leads do not penetrate the surfaces of the conductive regions 302A and 302B. In yet another example, the electronic component may include straight wires or leads (rather than bent leads) that are pressed far enough into the non-conductive region 304 to come into contact with the conductive regions 302A and/or 302B. In one example, the electronic component may be inserted manually, e.g., by a human operator. However, in another example, the electronic component may be inserted automatically, e.g., by a machine or a robot.

In block 208, the electronic component that was inserted in block 206 is fused to the first layer in a second plurality of passes of the additive manufacturing system. Thus, in one example, the fusing of block 208 is performed by the same additive manufacturing system that was used to build the first layer in the first plurality of passes in block 204 (e.g., system 100 of FIG. 1).

Figure 3C:
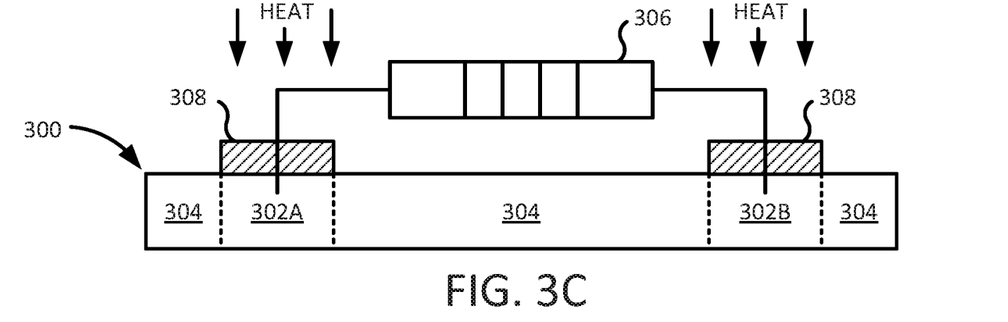
FIG. 3C illustrates the layer of FIGS. 3A and 3B with thin layers of a conductive fusing material coated over the conductive regions and that contact the electronic component.

In this example, the fusing may involve moving the moveable fluid ejection array 108 to the appropriate height along they dimension (e.g., so that it clears the electronic component inserted in block 206), and then passing the moveable fluid ejection array 108 across the build bed 106 in a first direction along the x dimension. Alternatively, the build bed may be lowered rather than raising the moveable fluid ejection array 108. As the moveable fluid ejection array 108 passes across the build bed, it may dispense a thin layer of a functional agent (e.g., silver nanoparticle ink) over at least the conductive regions of the first layer. The functional agent may comprise the first fusing agent used in block 204. FIG. 3C, for example, illustrates the layer 300 of FIGS. 3A and 3B with thin layers of a functional agent 308 coated over the conductive regions 302A and 302B that contact the electronic component 306.

The moveable curing array 110 may then pass across the build bed 106 in a first direction along the z dimension. As the moveable curing array 110 passes across the build bed, it emits energy (e.g., heat). In one example, application of the energy to the layer of functional agent raises the temperature of the functional agent to a temperature sufficient to fuse the electronic component that was inserted in block 206 into place (but below the critical temperature of the electronic component). For instance, the temperature of the functional agent may be raised to a temperature at or above its sintering temperature. Thus, where the functional agent comprises silver nanoparticle ink, the functional agent may be heated to approximately 140 degrees Celsius or hotter. The mechanism or process for fusing the electronic component into place may comprise sintering, ligand evaporation or decomposition, chemical bonding between particles (e.g., direct metal-metal bonding), drying, and/or other types of fusing processes.

Additionally, any metal leads or wires on the electronic component that are embedded or surface mounted in the conductive regions will absorb heat and will melt the conductive regions in localized areas surrounding the leads or wires. The conductive regions will subsequently cool in these localized areas, leading to better adhesion around the leads or wires. Thus, a robust physical and electrical connection is formed between the electronic component and the conductive regions of the first layer. The conditions of the additive manufacturing system may therefore be leveraged to connect the electronic component without removing the heterogeneous three-dimensional object from the additive manufacturing system, without pausing operation of the additive manufacturing system, and without allowing the layers of the three-dimensional heterogeneous object to cool to the point of hardening.

The method 200 ends in block 210. However, additional iterations of one or more of blocks 204-208 may be performed before fabrication of the heterogeneous three-dimensional object is completed. For instance, additional layers of conductive and/or non-conductive materials may be built over the electronic component, so that the electronic component is fully or partially embedded within the three-dimensional heterogeneous object and is fully functional. In another example, the electronic component may be positioned so that its leads or wires are embedded, but other portions of the electronic component (e.g., a light emitting diode, a cable connector, or a battery encasement) are not embedded. Furthermore, the electronic component could be mounted to any surface of the object (or layer of the object).

For instance, although FIG. 3C shows the electronic component 306 being mounted to a top surface of the first layer 300, the electronic component could also be mounted to one of the side surfaces of the first layer 300 (in which case the first layer 300 may include one or more conductive regions 302 on its side surfaces).

Figure 3D:
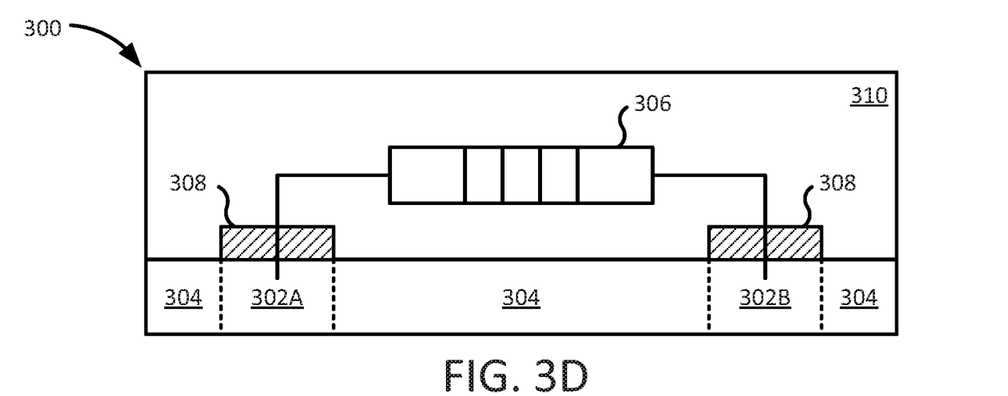
FIG. 3D illustrates a second layer that has been fabricated over the first layer and electronic component of FIGS. 3A-3C.

FIG. 3D illustrates a second layer 310 that has been fabricated over the first layer 300 and electronic component 306 of FIGS. 3A-3C. The second layer 310 may be built in a manner similar to the first layer 300 and may, like the first layer 300, comprise both conductive and non-conductive regions. In some examples, the conductive regions of the second layer 310 may electrically connect to the conductive regions 302A and/or 302B of the first layer 300 (e.g., through vias). Thus, the moveable fluid ejection array 108 and the moveable curing array 110 may make subsequent passes to fabricate additional layers of the heterogeneous three-dimensional object, which fuse to the prior layers, until the heterogeneous three-dimensional object is fully fabricated.

Although FIGS. 2 and 3A-3D illustrate a single electronic component being inserted into a single layer of a heterogeneous three-dimensional object, examples of the present disclosure may be used to insert any number of electronic components into one or any number of layers of a heterogeneous three-dimensional object. Moreover, the number of electronic components may include a variety of different types of electronic components.

Moreover, although the examples above discuss the use of silver nanoparticle ink as a functional fusing agent for the purposes of forming electrical connections between electronic components and conductive regions of a heterogeneous three-dimensional object, the examples discussed above may also utilize other functional fusing agents for the same purpose. For instance, other functional fusing agents that may be utilized include conductive and semi-conductive nanocarbons (e.g., graphene, carbon nanotubes, graphene nanoribbons), conducting and semi-conducting polymers (e.g., poly(3,4-ethylenedioxythiophene) polystyrene sulfonate, polythiophenes, polyacetylenes, poly(p-phenylene vinylene)), semi-conductive non-carbonaceous two-dimensional materials (e.g., tungsten disulfide, tungsten diselenide), and/or conducting, insulating, or semiconducting nanoparticles (e.g., silver, gold, copper oxide, silica, Groups III-V or II-VI semiconductors, etc.). Different functional fusing agents will have different fusing temperatures. In one example, the conductive regions of a layer of the heterogeneous three-dimensional object may be raised to a fusing temperature of the particular functional fusing agent being used (which may be dictated by a sintering temperature or a drying temperature of the functional fusing agent), while the temperature of the non-conductive regions of the layer may be raised to a different fusing temperature (which may be dictated by the melting point of the polymer powder).

Furthermore, although the examples above discuss the use of a metal (e.g., nickel) dithiolene complex as a fusing agent that is used to fuse non-conductive regions of a layer of the heterogeneous three-dimensional object, other fusing agents could be used to fuse the powder in these regions as well. For instance, fusing agents based on carbon black could be used in these regions.

As discussed above, in some examples, the electronic component that is being integrated into the heterogeneous three-dimensional object may be surface mounted to a layer of the object, e.g., so that the leads of the electronic component directly contact, but do not penetrate, the conductive regions of the layer. In one example, a flat electronic component (e.g., an integrated circuit chip) may be placed with its leads facing downward, i.e., in the y direction of FIG. 1, or toward the conductive regions of the layer being built (with enough pressure to make an electrical connection to the conductive regions). Powder and a conductive agent may be patterned over the conductive regions prior to placement of the electronic component in this case. The temperature of the conductive agent may be kept below its fusing temperature until the electronic component is inserted and ready to be fused. Once the electronic component is ready to be fused, the temperature may be raised so that the powder and conductive agent fuse to form an electrical connection between the electronic component and the conductive regions.

In another example, a flat electronic component may be placed with its leads facing upward, i.e., in the y direction of FIG. 1, or away from the layer being built. Force may be applied to partially or fully embed the electronic component in molten polymer of the layer being built. Powder may then be spread over the electronic component, and a conductive agent may be patterned over the areas where the leads are embedded. Enough conductive agent may be used so that the conductive agent penetrates down to the embedded electronic component through the powder, allowing for an electrical connection once the powder and conductive agent are fused.

Additionally, the techniques disclosed herein for forming internal conductive regions of a heterogeneous three-dimensional object could also be used to form external conductive leads, e.g., for electrical contact to be made on the sides of the completed heterogeneous three-dimensional object. For instance, these external conductive leads could be fabricated using a composite of a polymer and silver nanoparticles, or using silver nanoparticles alone for improved conductivity.

Moreover, conductive columns or pyramids of appropriate height could be fabricated between conductive regions of adjacent layers, thereby creating vias between the conductive regions. Similarly, traces (e.g., down to approximately twenty-one micron in size) could be fabricated within a layer to connect one or more electronic components inserted into the layer. These traces could be fabricated using a combination of different types of fluid agents or powders (e.g., a combination of conductive and insulating powders) in order to allow for the creation of complex and/or overlapping traces.

Figure 4:
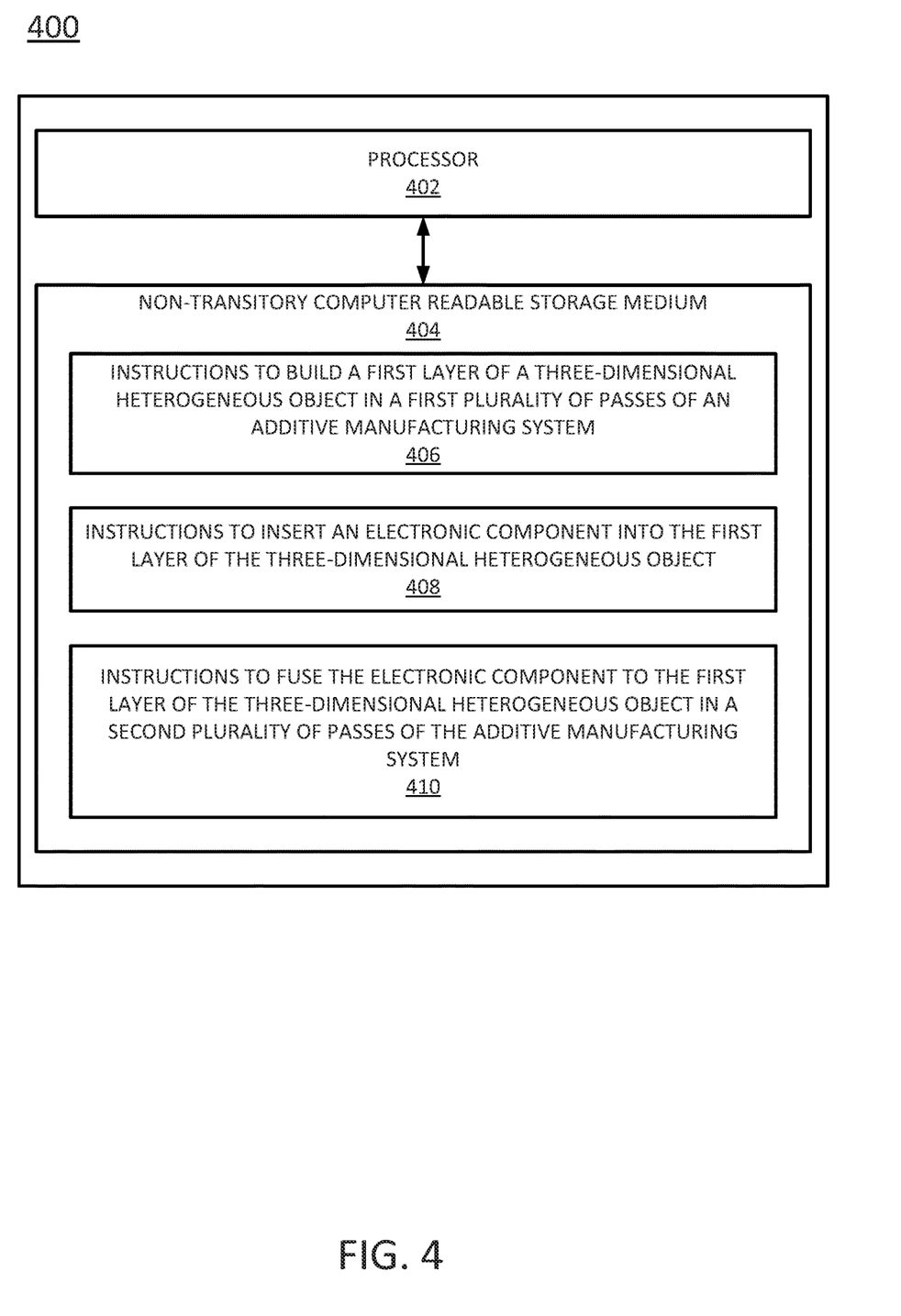
FIG. 4 depicts a high-level block diagram of an example computer that can be transformed into a machine capable of performing the functions described herein.

FIG. 4 depicts a high-level block diagram of an example computer 400 that can be transformed into a machine capable of performing the functions described herein. Notably, no computer or machine currently exists that performs the functions as described herein. As a result, the examples of the present disclosure modify the operation and functioning of the general-purpose computer to fuse electronic components into three-dimensional objects via additive manufacturing processes, as disclosed herein. In one example, the computer 400 may be the image processing system 102 of FIG. 1. In one example, the computer 400 may include a processor 402 and a non-transitory computer readable storage medium 404.

The processor 402 may comprise a hardware processor element 502, e.g., a central processing unit (CPU), a microprocessor, or a multi-core processor. Although one processor element is shown, it should be noted that the general-purpose computer may employ a plurality of processor elements. Furthermore, although one general-purpose computer is shown in the figure, if the method(s) as discussed above is implemented in a distributed or parallel manner for a particular illustrative example, i.e., the blocks of the above method(s) or the entire method(s) are implemented across multiple or parallel general-purpose computers, then the general-purpose computer of this figure is intended to represent each of those multiple general-purpose computers. Furthermore, a hardware processor can be utilized in supporting a virtualized or shared computing environment. The virtualized computing environment may support a virtual machine representing computers, servers, or other computing devices. In such virtualized virtual machines, hardware components such as hardware processors and computer-readable storage devices may be virtualized or logically represented.

The present disclosure can be implemented by machine readable instructions and/or in a combination of machine readable instructions and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the blocks, functions and/or operations of the above disclosed methods.

The non-transitory computer readable storage medium 404 may comprise a tangible or physical computer-readable storage device or medium, e.g., volatile memory, non-volatile memory, ROM memory, RAM memory, magnetic or optical drive, device or diskette and the like. More specifically, the non-transitory computer readable storage medium 404 may comprise any physical devices that provide the ability to store information such as data and/or instructions to be accessed by a processor or a computing device such as a computer or an application server.

The non-transitory computer readable storage medium 404 may include instructions 406, 408, and 410 that, when executed by the processor 402, cause the processor 402 to perform various functions. The instructions 406 may include instructions to build a first layer of a three-dimensional heterogeneous object in a first plurality of passes of an additive manufacturing system. The instructions 408 may include instructions to insert an electronic component into the first layer of the three-dimensional heterogeneous object. These instructions 408 may be omitted, however, in the event that the electronic component is inserted manually as discussed above, or may simply include instructions for making the additive manufacturing system safely accessible to a human operator who is manually inserting the electronic component. The instructions 410 may include instructions to fuse the electronic component to the first layer of the three-dimensional heterogeneous object in a second plurality of passes of the additive manufacturing system.

When a hardware processor executes instructions to perform "operations", this could include the hardware processor performing the operations directly and/or facilitating, directing, or cooperating with another hardware device or component, e.g., a co-processor and the like, to perform the operations.

It will be appreciated that variants of the above-disclosed and other features and functions, or alternatives thereof, may be combined into many other different systems or applications. Various presently unforeseen or unanticipated alternatives, modifications, or variations therein may be subsequently made which are also intended to be encompassed by the following claims.

What is claimed is:

1. A method, comprising:
building a first layer of a three-dimensional heterogeneous object in a first plurality of passes of an additive manufacturing system, wherein the first layer comprises a conductive region formed with a first fusing agent and a non-conductive region formed with a second fusing agent that is different from the first fusing agent;
using a first pressure, inserting leads of an electronic device directly into the conductive region of the first layer while the conductive region of the first layer is pliable; and
fusing the leads of the electronic device to the conductive region of the first layer using the first fusing agent in a second plurality of passes of the additive manufacturing system, wherein fusing the leads of the electronic device to the conductive region of the first layer occurs at the same time as fusing the conductive region of the first layer.

2. The method of claim 1, wherein the additive manufacturing system is a multi jet fusion additive manufacturing system.

3. The method of claim 1, wherein the fusing comprises:
dispensing a layer of the first fusing agent on the conductive region, subsequent to the inserting; and
heating the layer of the first fusing agent to a temperature that is sufficient to fuse the leads of the electronic device to the conductive region.

4. The method of claim 3, wherein the first fusing agent comprises silver nanoparticle ink.

5. The method of claim 1, further comprising:
building a second layer of the three-dimensional heterogeneous object over the electronic device and the first layer in the second plurality of passes of the additive manufacturing system, subsequent to the fusing.

* * * * *